US006573795B2

(12) United States Patent
Whitney et al.

(10) Patent No.: US 6,573,795 B2
(45) Date of Patent: Jun. 3, 2003

(54) LOW QUIESCENT POWER CLASS AB CURRENT MIRROR CIRCUIT

(75) Inventors: David Hall Whitney, Westford, MA (US); Chau Cuong Tran, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/008,025

(22) Filed: Nov. 8, 2001

(65) Prior Publication Data

US 2002/0180531 A1 Dec. 5, 2002

Related U.S. Application Data

(60) Provisional application No. 60/295,717, filed on Jun. 4, 2001.

(51) Int. Cl.[7] .................................................. H03F 3/04
(52) U.S. Cl. ........................ 330/288; 330/296; 323/315
(58) Field of Search ................................. 330/288, 296; 323/315, 316

(56) References Cited

U.S. PATENT DOCUMENTS

| 4,471,236 A | * | 9/1984 | Patterson, III | 307/310 |
| 5,079,518 A | * | 1/1992 | Wakayama | 330/288 |
| 5,373,253 A | * | 12/1994 | Bailey et al. | 330/288 |

* cited by examiner

Primary Examiner—Henry Choe
(74) Attorney, Agent, or Firm—Iandiorio & Teska; R. Stephen Rosenholm; Kirk Teska

(57) ABSTRACT

A low quiescent power class AB current mirror circuit includes a first input transistor for receiving an input current and a second output transistor for providing an output current; the first and second transistors having bases connected together; and a first current supply for sinking current from the bases in response to a decrease in input current to lower the quiescent point of the transistors.

1 Claim, 3 Drawing Sheets

LOW QUIESCENT POWER CLASS AB CURRENT MIRROR CIRCUIT

RELATED APPLICATIONS

This invention claims priority of Provisional Patent Application Serial No. 60/295,717 filed Jun. 4, 2001.

FIELD OF THE INVENTION

This invention relates to a low quiescent power class AB current mirror circuit.

BACKGROUND OF THE INVENTION

In a conventional current mirror circuit, the output current mirrors the input current. The bases of both transistors of the current mirror circuit are connected together and both base currents are derived from the input current. Thus, the output current is reduced relative to the input current by the two base currents introducing an error of $2I_B$. In an improved design, to reduce this error, a third transistor and a current source are used to supply the base currents thus eliminating that source of error. But it introduces another, lesser source of error, i.e. the current required to drive the base of the third transistor which is much smaller. However, with the addition of the third transistor there is now a two $V_{BE}$ drop at the first input transistor. A fourth transistor of opposite polarity to the third transistor can be added which subtracts one $V_{BE}$. This circuit configuration operates generally at a low quiescent or operating point with good efficiency and can respond to an increase in the input current by quickly increasing the operating point of both the input and output transistors. However, when the input current again decreases, the operating point is not quickly returned to the lower operating point.

BRIEF SUMMARY OF THE INVENTION

It is therefore an object of this invention to provide a class AB current mirror circuit with a low quiescent power.

It is a further object of this invention to provide such an improved current mirror circuit which has improved bandwidth and transient response with a low quiescent power.

It is a further object of this invention to provide such an improved current mirror circuit with low quiescent power which quickly returns to a lower quiescent power operating point when the input signal decreases.

It is a further object of this invention to provide such an improved current mirror circuit with low quiescent power which has lower input base current error.

It is a further object of this invention to provide such an improved current mirror circuit with low quiescent power which has a low input voltage headroom requirement.

This invention results from the realization that a low quiescent power class AB current mirror which maintains lower base input current error and has a low input voltage headroom requirement can be achieved with a current supply which is connected to the bases of the input and output transistors and sinks current from those bases in response to a decrease in input current in order to quickly lower the operating point of the circuit.

This invention features a low quiescent power class AB current mirror circuit including a first input transistor for receiving an input current and a second output transistor for providing an output current. The first and second transistors have their bases connected together. There is a first current supply for sinking current from the bases in response to a decrease in input current to lower the quiescent point of the transistors.

In a preferred embodiment the first current supply may include a third sink transistor connected between the base of the second output transistor and a first power supply bus. The first current supply may also include a first current source connected between the base of the third sink transistor and the first power supply bus. The first current supply may also include a fourth biasing transistor interconnected between the base of the third sink transistor and a second power supply bus. There may be a second current supply for sourcing current to the bases of the transistors in response to an increase in input current to raise the quiescent point of the transistors. The second current supply may include a fifth transistor connected between the base of the first and second transistors and the second power supply bus. The fifth transistor may have a base connected to the second power supply bus through a second current source. There may be a sixth transistor for shifting the levels between the fifth transistor and the first transistor. The fourth and sixth transistors may be complementary bipolar devices with their bases interconnected and with offsetting base currents.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
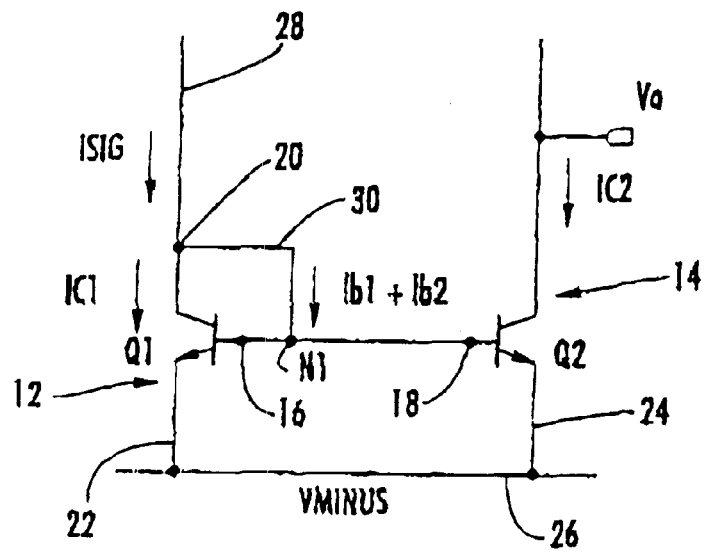
FIG. 1 is a schematic diagram of a simple prior art current mirror.

There is shown in FIG. 1 a simple prior art current mirror 10 including a first input transistor 12 and a second output transistor 14. Their bases 16 and 18 are connected together and both are connected to the collector 20 of transistor 12. The emitters 22 and 24 of each of transistors 12 and 14 are connected to the negative bus 26. When an input current signal $I_{sig}$ is provided on line 28 to the collector 20 of transistor 12 it is desired to have that current mirrored in transistor 14. Actually an exact replica does not occur because the input current on line 28 splits, most of it becomes the current through transistor 12, current $I_{C1}$, but some of it is delivered on line 30 to supply the $I_{B1}$ and $I_{B2}$ currents to transistors 12 and 14 respectively. Thus, currents $I_{C1}$ and $I_{C2}$ flowing through transistors 12 and 14, are the same, but $I_{C2}$ does not mirror the input current $I_{sig}$ on line 28 because a portion of that current has been diverted to provide for $I_{B1}$ and $I_{B2}$. This error is referred to as the base current error.

Figure 2:
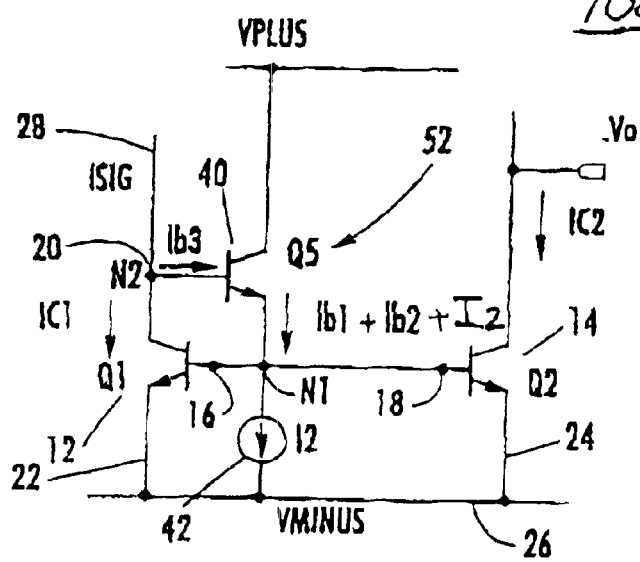
FIG. 2 is a view similar to FIG. 1 of a prior art current mirror with reduced base current error.

In one approach, this base current error may be reduced as shown in FIG. 2 by the addition of a current supply 52 including a third transistor 40 and a current source 42. Base currents, $I_{B1}$ and $I_{B2}$ are now supplied by transistor 40. The signal dependent base current $I_{B3}$ is reduced by a factor of $\beta$ from the signal dependent values of $I_{B1}$ and $I_{B2}$. $\beta$ is approximately one hundred and so the error is reduced by a factor of one hundred. Another problem that occurs in the prior art current mirror 10a of FIG. 2, is that now there are two $V_{BE}$ drops from the current mirror input to the supply bus, one from the emitter to base of transistor 40 and another from the base to emitter of transistor 12.

Figure 3:
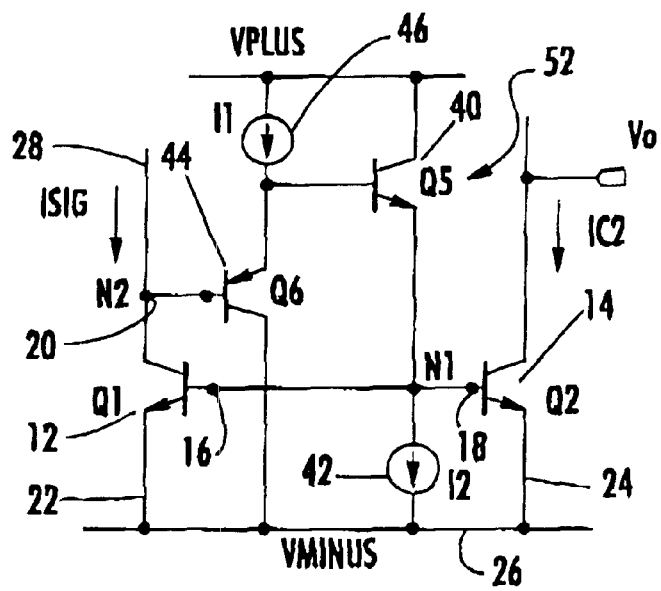
FIG. 3 is a view similar to FIG. 2 of a prior art current mirror with reduced base current error and lower voltage at the collector of the input transistor.

To overcome this, as shown in current mirror 10b, FIG. 3, a fourth level shifting transistor 44 with current supply source 46 can be added. Now there are two $V_{BE}$ drops produced by transistors 12 and 40 in one direction and one $V_{BE}$ drop in the other direction produced by transistor 44 so that the total collector to emitter voltage of transistor 12 is now simply one $V_{BE}$.

One of the shortcomings of these prior art current mirror configurations is that they are typically efficient only for a rapid increase in the signal current. When the input signal on line 28 increases, the operating point must also increase to accommodate the larger signal. This is typically done, for example by the transistor 40 and current source 42 in FIG. 3, and the response can be quick. However, when the signal on line 28 subsequently decreases, it is desirable for the operating point to decrease just as quickly. The speed at which the operating point can be decreased is limited by the magnitude of current source 42. This current must always be large enough to provide the base currents required to quickly decrease the collector currents of the input and output devices, transistors 12 and 14. This requirement reduces the efficiency of the current mirror.

In accordance with this invention, a current supply is provided which can supply the current required to change the operating point when needed without requiring a large quiescent current. Thus, the current mirror is said to be operating "CLASS AB". This improves the overall efficiency of the current mirror.

Figure 4:
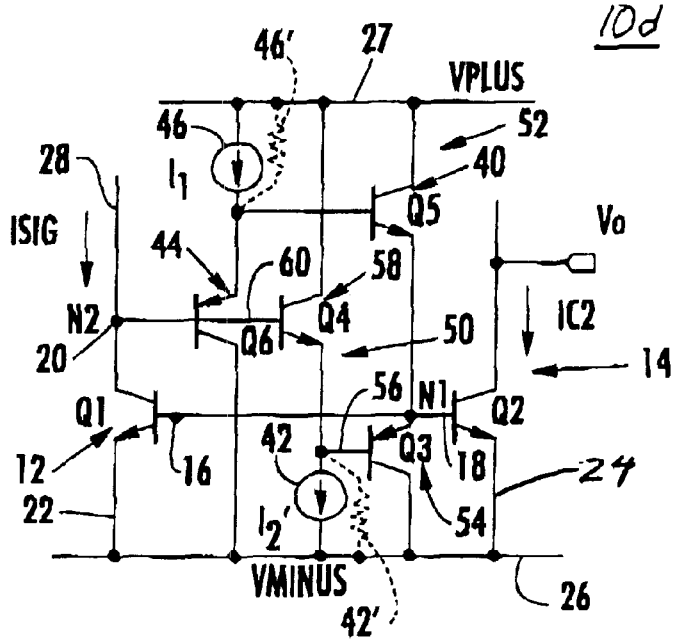
FIG. 4 is a schematic diagram similar to FIG. 3 of a low quiescent power class AB current mirror circuit in accordance with this invention.

In accordance with this invention, FIG. 4, a current supply 50 is added in addition to the current supply 52. Current supply 50 includes transistor 54 connected between the base 18 of transistor 14 and the bus or lower rail 26. Its base 56 is connected through current source 42 to bus 26. Current supply 50 also includes another transistor 58 connected between the positive rail or bus 27 and the base 56 of transistor 54. The base 60 of transistor 58 is connected to the base of transistor 44 and in turn to point 20, node N2. The first current supply 50 acts to sink current from the bases of transistors 12 and 14 while current supply 52 sources current to base 18 of transistor 14 and base 16 of transistor 12.

Figure 5:
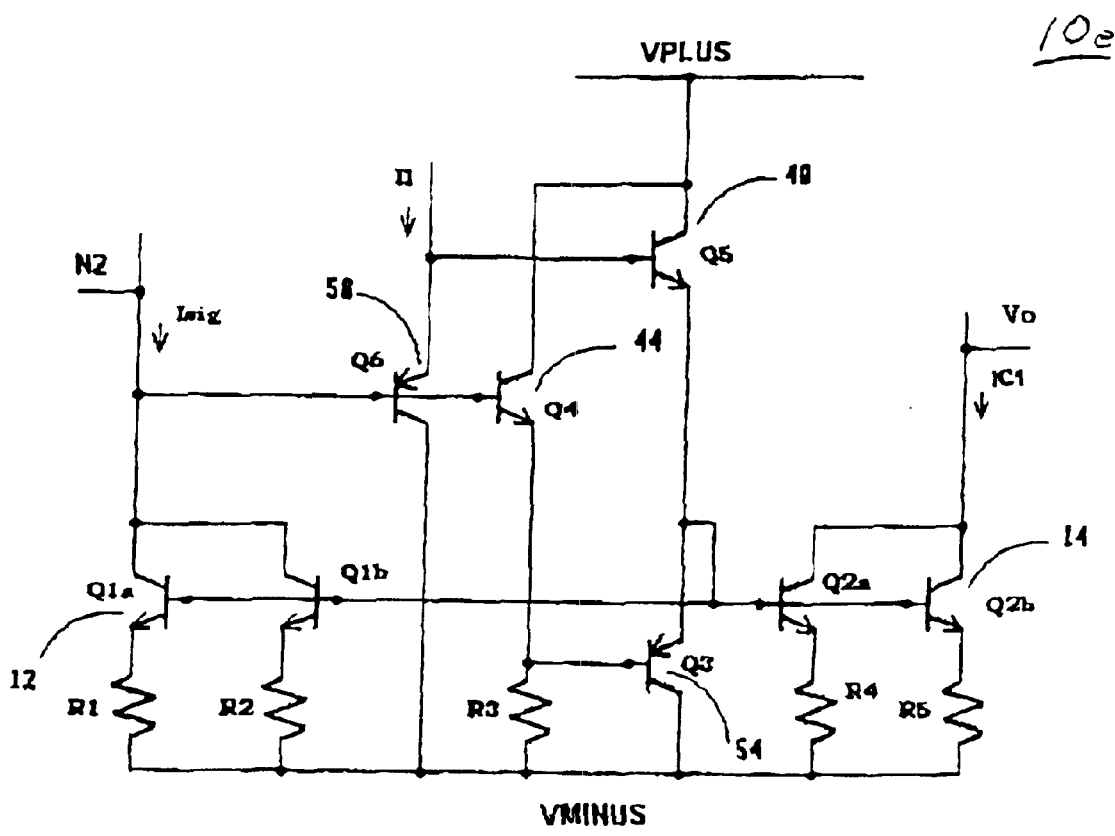
FIG. 5 is a more detailed schematic of the circuit of FIG. 4.

When current mirror circuit 10d, FIG. 4 operates in a normal fashion, and assuming an increased input signal occurs at 28, the following occurs. The voltage at point 20, node N2, increases thereby increasing the voltage on the emitter of transistor 44 and the base of transistor 40. Transistor 40 now conducts more and sources more current to bases 16 and 18, raising the quiescent point to accommodate the larger signal at input 28. The increased voltage is also reflected through transistor 58 to the base 56 of transistor 54 which causes it to conduct less so that the current sourcing from transistor 40 will be primarily directed to bases 16 and 18. When the input signal on line 28 decreases once again, this circuit can rapidly respond because the decrease in voltage at point 20, node N2 is now reflected to the base of transistor 40 so that it decreases the flow of current that is sourcing to bases 16 and 18. And, significantly, the decrease in voltage reflected through bias transistor 58 reflected to base 56 of transistor 54 causes it to conduct more and sink the current away from bases 16 and 18 so that the circuit rapidly returns a low operating point. A more detailed implementation of the circuit of FIG. 4 is shown in FIG. 5.

Although current sources 46 and 42 are shown as conventional current sources they may instead simply be resistances as shown at 46' and 42'. All of the transistors in FIG. 4 are shown as bipolar NPN transistors with the exception of transistors 44 and 54 which are PNP transistors. The effect of transistor 44 being a PNP and transistor 58 being a NPN and having their bases connected together is that their base currents offset one another so that even the small error provided by the base current of transistor 40 as explained with reference to FIG. 2 and which also is relevant with respect to transistor 44 of FIG. 3 is reduced to the point where it becomes negligible. Thus, this circuit maintains and improves the reduction of the base current error. Although bus 26 is shown as a negative power supply and bus 27 as a positive, this is not a necessary limitation of the invention. For example, if transistors 12 and 14 are made to be PNP transistors instead of NPN then the buses will have the opposite polarities as shown, while the remaining transistors maintain their polarity connections, that is, the emitters 22 and 24 would be connected to bus 27 instead of bus 26. If the circuit is implemented in CMOS using FETs, the offsetting base currents of transistors 44 and 58 would not occur since they are no longer opposite polarity bipolar transistors. However, as the CMOS technology is reduced in size there may be leakage currents associated with the transistors such that the connection shown provides a similar benefit.

Thus, current mirror circuits 10d and 10e have a low quiescent power improved bandwidth and transient response. The current mirror quickly returns to a lower quiescent operating point when the input signal decreases. Moreover, there is lower input base current error. Also, the current mirror circuit has a low input voltage headroom requirement. In the preferred embodiment, a current supply 50, FIG. 4 is connected to the bases of the input and output transistors and sinks current from those bases in response to a decrease in input current in order to quickly lower the quiescent point of the circuit.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A low quiescent power class AB current mirror circuit comprising:

a first input transistor for receiving an input current and having a base;

a second output transistor for providing an output current and having a base, said first input and second output transistors having their bases connected together;

a first and second source transistor and a first current source, the first source transistor is PNP transistor type and the second source transistor is a NPN transistor type, each of said source transistors having a base, an emitter and a collector; and where the base of the first source transistor is connected to the input current, the emitter of the first source transistor is connected to a first power supply bus and the collector of the first source transistor is connected to a negative power supply bus, where the base of the second source transistor is connected to the emitter of the first source transistor, the collector of the second source transistor is connected to the first power supply bus and the emitter of the second source transistor is connected to the bases of the first input transistor and the second output transistor;

the first current source connects between the first power supply bus and the emitter of the first source transistor and supplying current in the direction of the emitter of the first source transistor;

a first and a second sink transistors, the first sink transistor is a NPN transistor type and the second sink transistor is a PNP transistor type, each of said sink transistors having a base, an emitter and a collector; and where the base of the first sink transistor is connected to the input current, the collector of the first sink transistor is connected to the first power supply bus and the emitter of the first sink transistor is connected to the negative power supply bus, and where the base of the second sink transistor is connected to the emitter of the first sink transistor, the collector of the second sink transistor is connected to the negative power supply bus and the emitter of the second sink transistor is connected to the bases of the first input transistor and the second output transistor.

* * * * *